US006305556B1

(12) United States Patent
Mayer

(10) Patent No.: US 6,305,556 B1
(45) Date of Patent: Oct. 23, 2001

(54) CABLE MANAGEMENT SOLUTION FOR RACK-MOUNTED COMPUTERS

(75) Inventor: David W. Mayer, Fort Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/697,274

(22) Filed: Oct. 26, 2000

(51) Int. Cl.[7] ........................................ A47F 5/00
(52) U.S. Cl. ................... 211/26; 211/175; 312/223.2; 361/826; 361/683
(58) Field of Search ...................... 211/26, 175, 189; 361/826, 727, 829, 683; 312/223.2

(56) References Cited

U.S. PATENT DOCUMENTS

| | | | |
|---|---|---|---|
| 3,295,905 | * | 1/1967 | Sisk et al. . |
| 3,710,199 | * | 1/1973 | Cignoni . |
| 4,614,383 | * | 9/1986 | Polley et al. . |
| 4,893,381 | * | 1/1990 | Frankel . |
| 5,390,883 | * | 2/1995 | Songhurst . |
| 5,460,441 | * | 10/1995 | Hastings et al. ................. 361/683 X |
| 5,571,256 | | 11/1996 | Good et al. ............................ 211/26 |
| 5,587,877 | * | 12/1996 | Ryan et al. ........................... 361/683 |
| 5,726,866 | * | 3/1998 | Allen ................................. 361/727 X |
| 5,850,925 | | 12/1998 | Gandre .................................... 211/26 |
| 5,890,602 | * | 4/1999 | Schmitt ............................... 211/26 X |
| 6,021,047 | | 2/2000 | Lopez ................................... 361/727 |
| 6,070,742 | * | 6/2000 | McAnally .............................. 211/26 |
| 6,170,784 | * | 1/2001 | MacDonald et al. ............. 211/26 X |

* cited by examiner

*Primary Examiner*—Robert W. Gibson, Jr.
(74) *Attorney, Agent, or Firm*—Kevin M Hart

(57) ABSTRACT

A hinging cable management arm is disposed inside a rack behind a slidingly mounted computer. The arm folds and unfolds as the computer slides into and out of the rack. Cables from the computer are secured to the arm with cable ties. The arm includes two elongate members hingingly coupled to one another at one end. At the other end, one member is hingingly coupled to the rack and one member is hingingly coupled to a sliding computer mount. Each elongate member has a u-shaped profile. The hinged couplings are implemented using swaged pins. The cable ties are straps made with hook-and-loop fabric. The straps are made captive to the elongate members by anchoring them at a first slot and threading them through a second slot. They are wrapped over the computer cables and around the profile of the elongate members until the hook-and-loop material secures to itself.

14 Claims, 8 Drawing Sheets

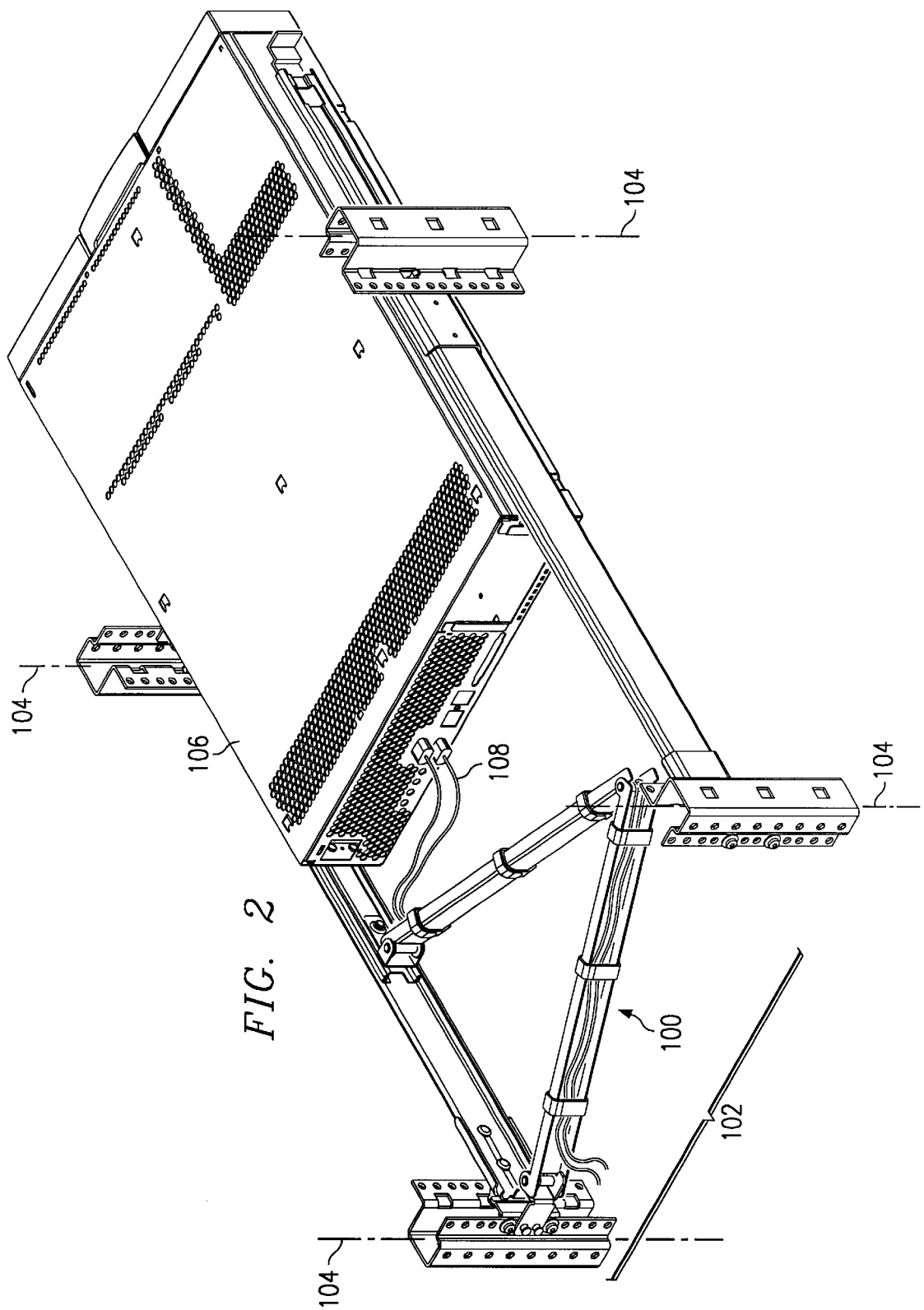

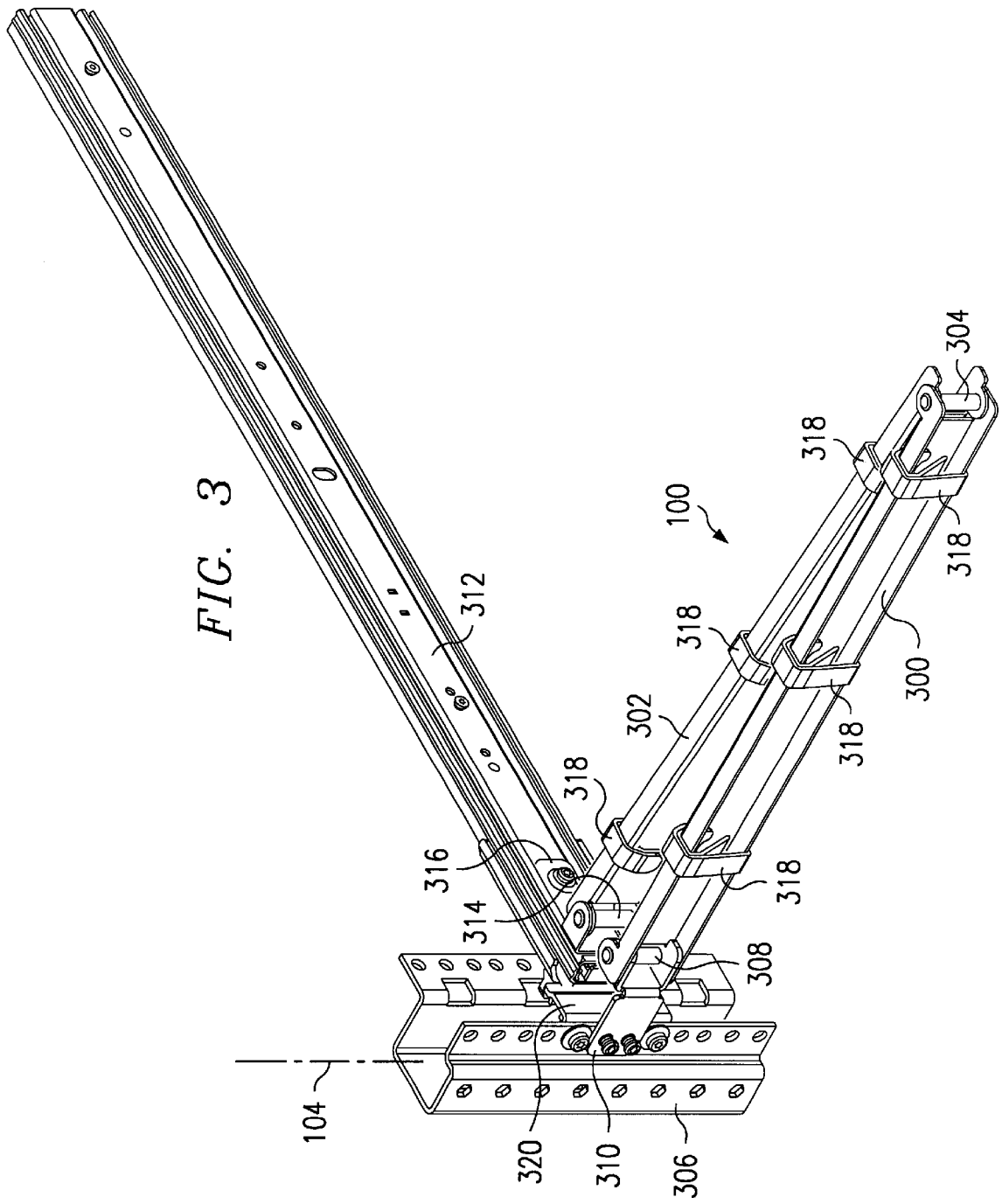

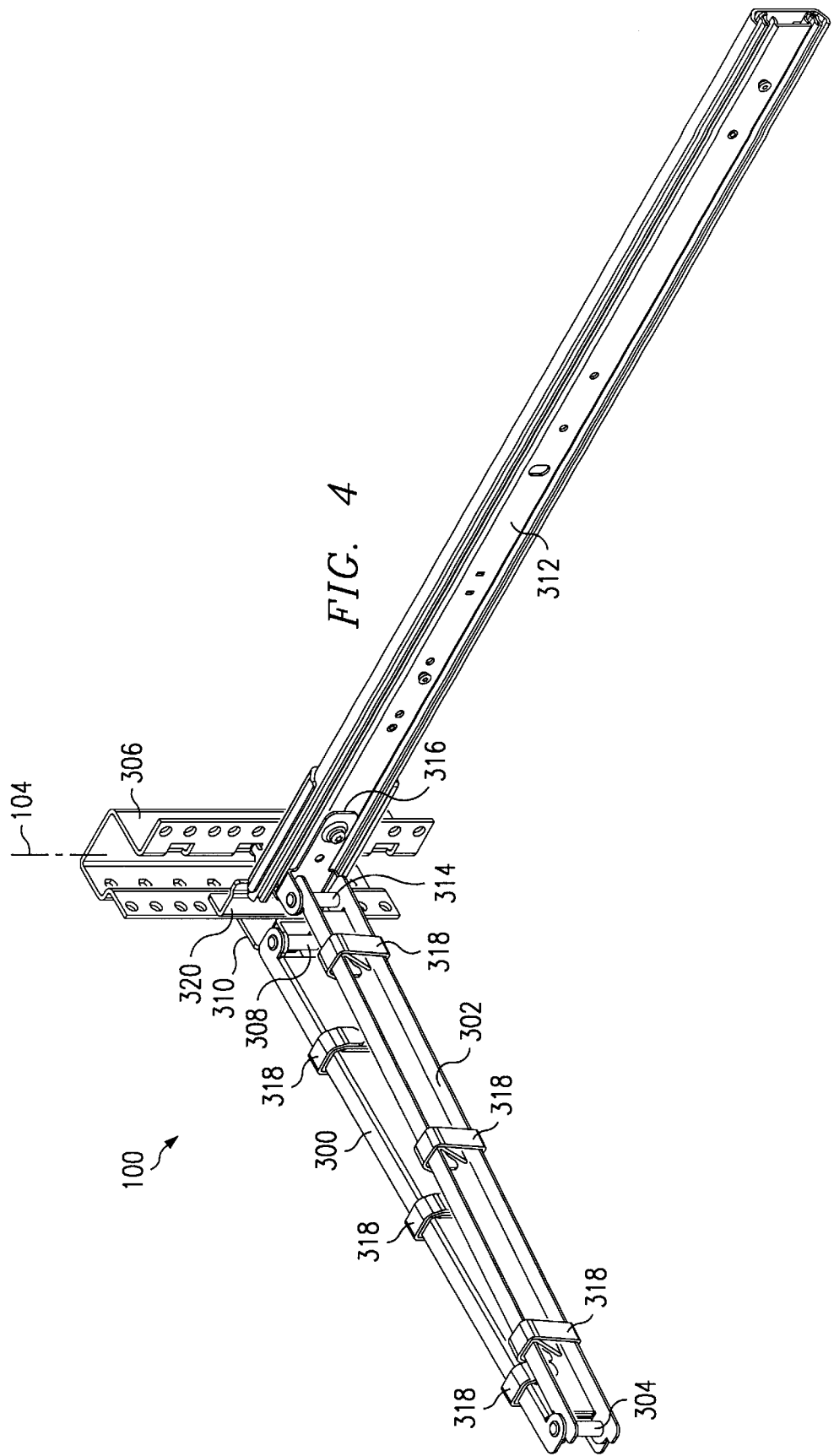

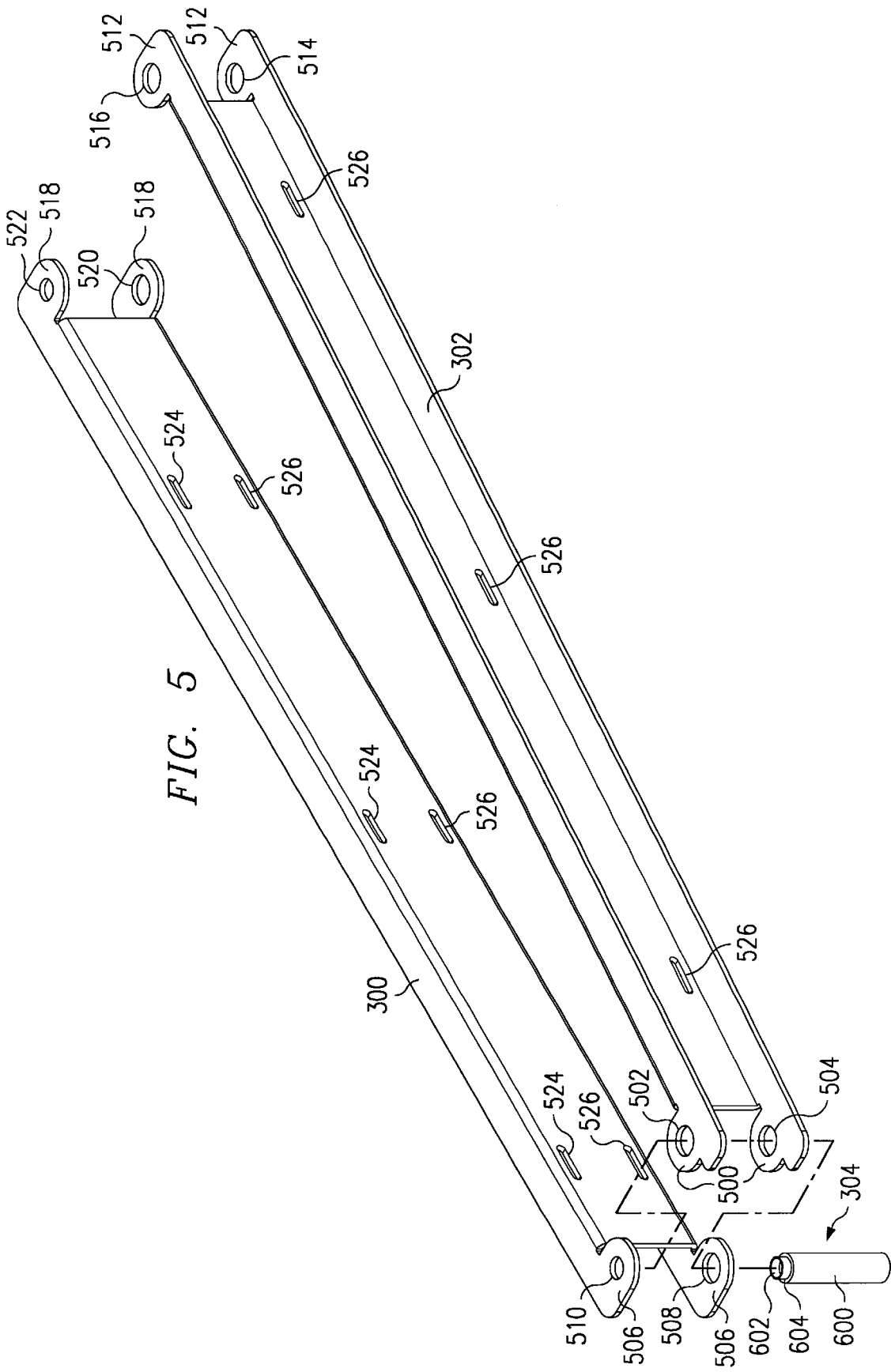

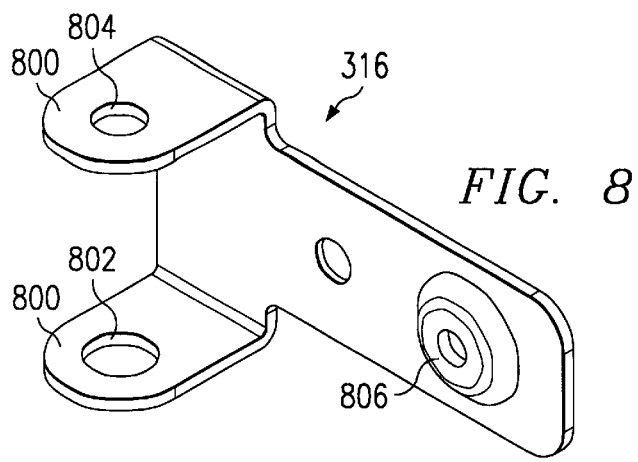
FIG. 8
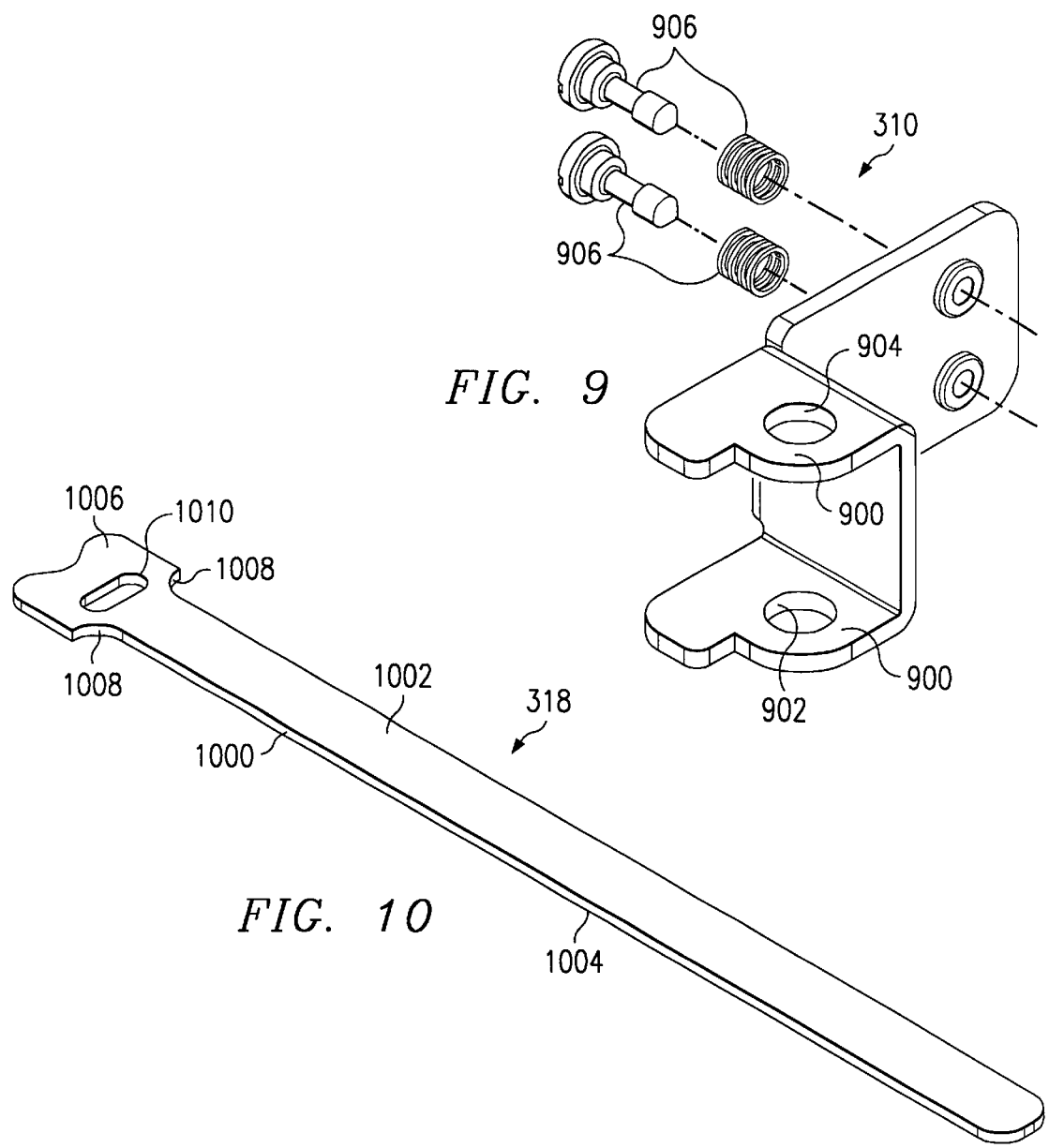
FIG. 9
FIG. 10

CABLE MANAGEMENT SOLUTION FOR RACK-MOUNTED COMPUTERS

FIELD OF THE INVENTION

This invention relates to techniques for managing computer cables in a rack mount environment.

BACKGROUND

In commercial settings, multiple computer enclosures are sometimes mounted in a vertical rack structure. This technique is referred to as "rack mounting," and is most frequently used with server-type computers that are accessed remotely via a network. Most rack structures include numerous horizontal slots or drawers in which computer enclosures are received, thereby creating a stacked arrangement of the computer enclosures.

Each computer in a rack has numerous cables associated with it (for example, a power cable and a network connection cable). In addition, numerous computers are housed in each rack. Consequently, managing the aggregation of cables in the rack can become a challenge.

It is an object of the invention to provide an improved technique for managing computer cables inside a rack structure.

SUMMARY OF THE INVENTION

In one aspect, the invention includes a hinging cable management arm that may be disposed inside a rack behind a slidingly mounted computer enclosure. When the computer enclosure slides into the rack, the cable management arm folds into a retracted position. When the computer enclosure slides out of the rack, the cable management arm unfolds into an extended position. Cables from the computer are secured to the hinging arm so that they follow the folding and unfolding motion of the arm.

In another aspect, a cable management arm according to the invention may include two elongate members, each having first and seconds. The first ends of the elongate members are hingingly coupled to one another. The second end of one of the members is hingingly coupled to the rack. The second end of the other member is hingingly coupled to a sliding mount for the computer enclosure.

In another aspect, wrap-around cable ties may be used to secure the computer cables to the arm. The wrap-around cable ties may be made of straps having hooks on one side and loops on the other side so that the ties will be reusable and easily fastened and unfastened. The straps may also be made captive to the elongate members by anchoring them at a first slot formed in the elongate member, threading them through a second slot formed in the elongate member, and then wrapping them over the computer cables and around the profile of the elongate member until the hook-and-loop material secures to itself.

In a further aspect, the elongate members may be generally u-shaped in profile to better retain the computer cables.

In a still further aspect, the hinges used to fasten the elongate members to one another, to the rack, and to the sliding mount for the computer enclosure may be implemented using swaged pins for robustness and low cost.

BRIEF DESCRIPTION OF THE DRAWINGS

FIG. 2 is an oblique view of the cable management arm of FIG. 1 in an extended position.

FIG. 3 is an oblique view of the cable management arm of FIG. 1 viewed from the back of the computer rack.

FIG. 4 is an oblique view of the cable management arm of FIG. 1 viewed from the front of the computer rack.

FIG. 5 is an exploded oblique view of the center hinge of the cable management arm of FIG. 1.

FIG. 8 is an oblique view of the sliding computer mount coupler of FIG. 1.

FIG. 9 is an exploded oblique view of the rack coupler of FIG. 1.

FIG. 10 is an oblique view of one of the cable tie straps of FIG. 1.

DETAILED DESCRIPTION OF THE PREFERRED EMBODIMENTS

Figure 1:
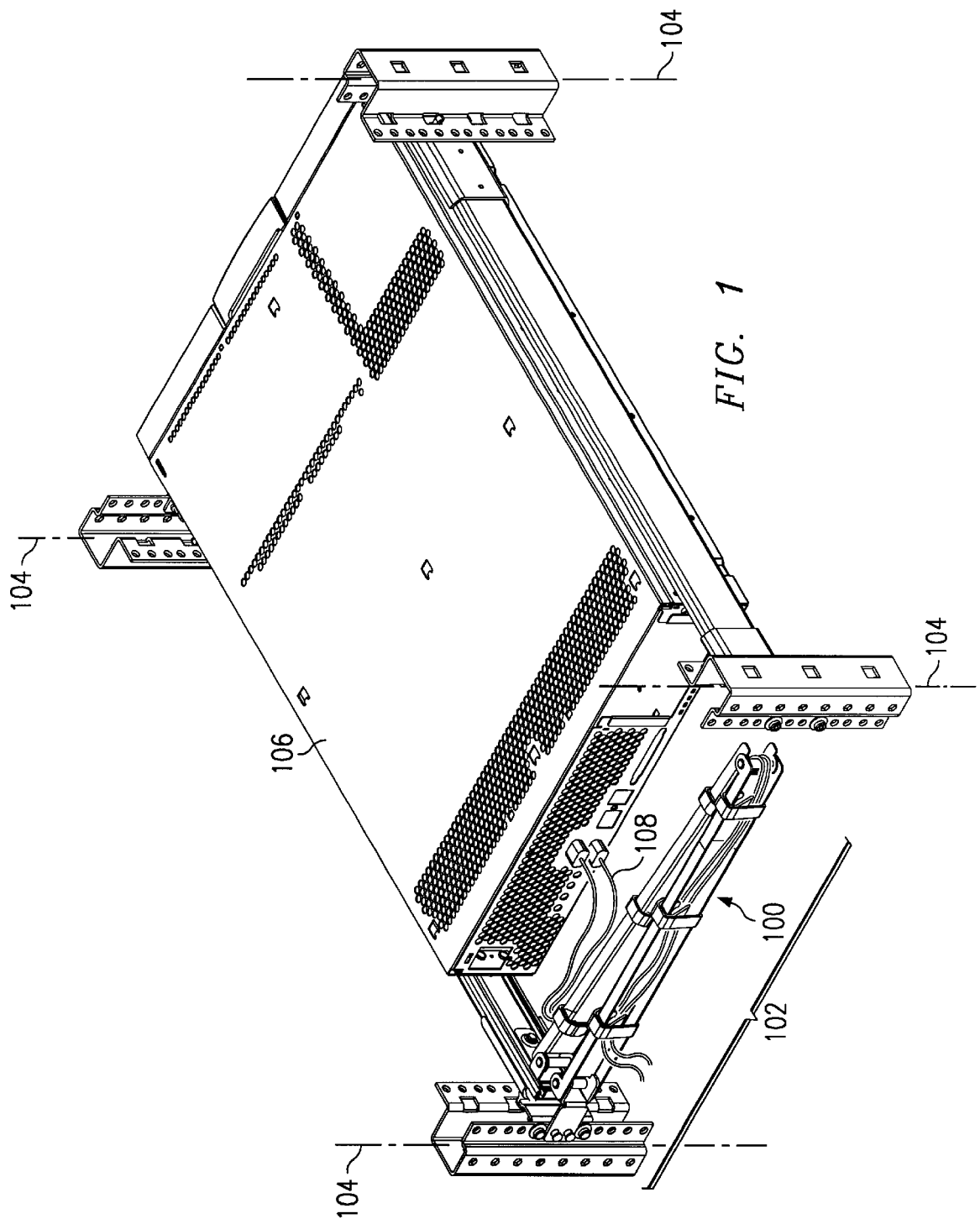
FIG. 1 is oblique view of a cable management arm according to a preferred embodiment of the invention, disposed in one of the slots of a computer rack in a retracted position.

FIGS. 1 and 2 illustrate a hinging cable management arm 100 according to a preferred embodiment of the invention. Arm 100 is shown housed in one of the horizontal slots 102 of a vertical computer rack 104 behind a slidingly mounted computer enclosure 106. When computer enclosure 106 slides into rack 104, arm 100 folds into the retracted position shown in FIG. 1. When computer enclosure 106 slides out of rack 104, arm 100 unfolds into the extended position shown in FIG. 2. Cables 108 from the computer are secured to hinging arm 100 so that they follow the folding and unfolding motion of arm 100.

FIGS. 3 and 4 provide a more detailed view of cable management arm 100. Arm 100 includes two elongate members 300, 302. Elongate members 300, 302 are hingingly coupled to one another at hinge 304. One end of elongate member 300 is hingingly coupled to corner post 306 of rack 104 via hinge 308 and rack coupler 310. One end of elongate member 302 is hingingly coupled to sliding computer mount 312 via hinge 314 and sliding computer mount coupler 316. Cable ties 318 are provided for securing computer cables 108 to arm 100. In the embodiment shown, sliding computer mount 312 constitutes one of the sliding rails of a telescoping slide rail assembly; other suitable sliding computer mount apparatus may be used with arm 100.

Figure 6A:
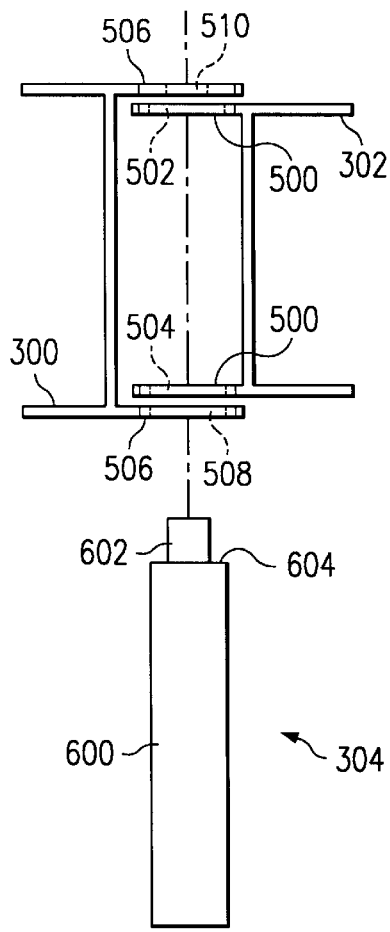
FIGS. 6A–C are side views illustrating a preferred technique for assembling the center hinge of FIG. 1.
Figure 6B:
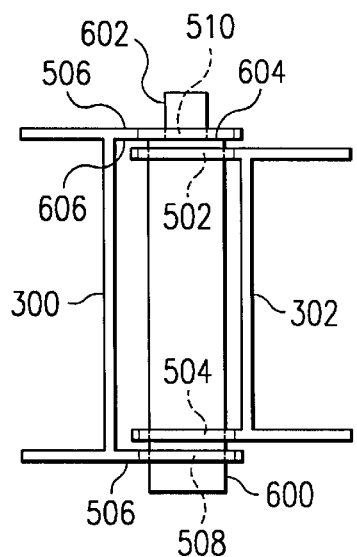
Figure 6C:
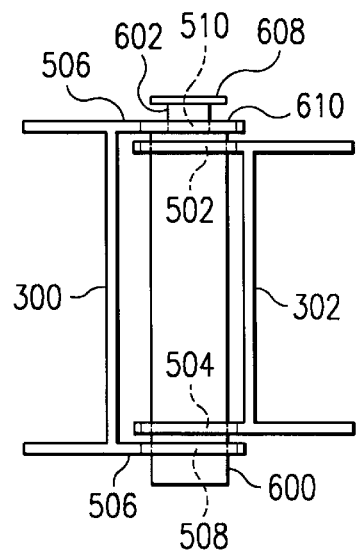
Figure 7:
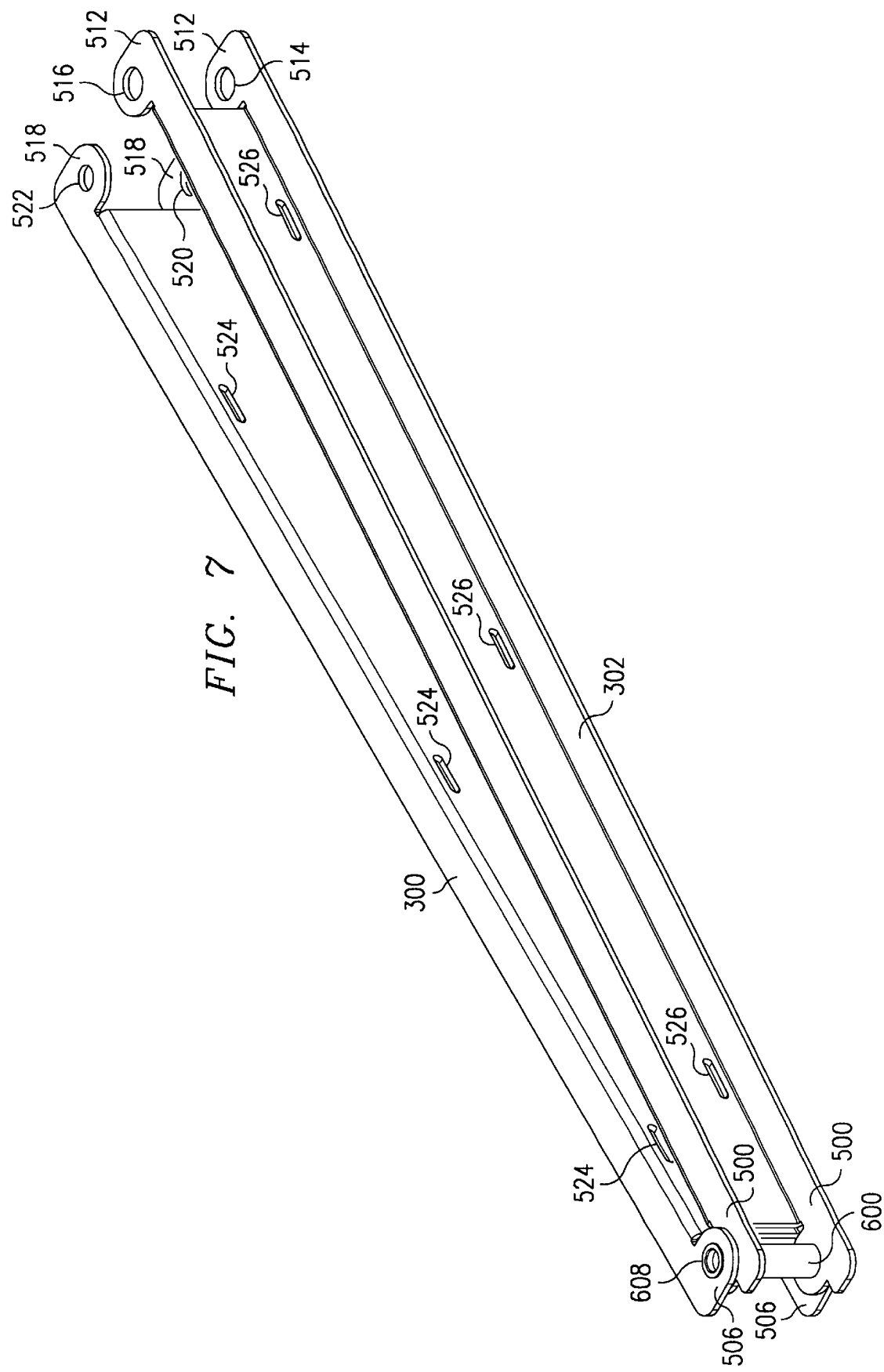
FIG. 7 is an assembled oblique view of the center hinge of FIG. 1.

FIGS. 5–7 provide a detailed view of a preferred assembly for hinge 304. Pin 304 has a body portion 600 and a stem portion 602 on one end of the body portion. Both the body portion 600 and the stem portion 602 have circular cross sections; but the diameter of the body portion is larger than that of the stem portion. The junction between stem portion 602 and body portion 600 defines a shoulder 604. On the end of elongate member 302 is a first bracket 500 defining first and second large holes 502 and 504. On the end of elongate member 300 is a second bracket 506 defining a third large hole 508 and a small hole 510. Large holes 502, 504 and 508 are large enough to clear the diameter of body portion 600 of pin 304. Small hole 510 is large enough to clear the diameter of stem portion 602, but not that of body portion 600.

Referring now to FIG. 6A, elongate members 300, 302 are brought together so that large holes 502, 504 are disposed between large hole 508 and small hole 510. Then, referring now to FIG. 6B, pin 304 is inserted through the holes so that body portion 600 passes through holes 502, 504 and 508 as shown, and stem portion 602 passes through small hole 510. This having been done, shoulder 604 will be adjacent to an inside surface 606 of bracket 506 around the perimeter of small hole 510. Finally, referring now to FIG. 6C, the end of stem 602 is swaged over so that the swaged portion 608 extends over an outside surface 610 of bracket 506 around the perimeter of small hole 510. Pin 304 is now secured to elongate member 300, and elongate member 302 is hingingly held captive by bracket 506 and by body portion 600 of pin 304. The final assembly is shown in FIG. 7. The same swaged pin hinge technique just described may be used at hinges 308 and 314 as follows:

Referring now to FIG. 8, sliding computer mount coupler 316 forms part of hinge 314. Coupler 316 has a bracket 800 formed on one end defining a large hole 802 and a small hole 804. Functionally, large hole 802 corresponds with hole 508 in the above discussion of hinge 304, and small hole 804 corresponds with hole 510. Pin 314 may be identical with pin 304. The end of elongate member 302 opposite hinge 304 forms the remainder of hinge 314. It has a bracket 512 formed thereon defining two large holes 514, 516. Functionally, holes 514, 516 correspond with holes 502, 504 in the above discussion. Hinge 314 may be assembled in the same manner as is hinge 304. Alternatively, the large/small hole pair may be placed on bracket 512, while the large/large hole pair may be placed on bracket 800. Coupler 316 may be secured to sliding computer mount 312 by any conventional means, such as with a screw through orifice 806.

Referring now to FIG. 9, rack coupler 310 forms part of hinge 308. Coupler 310 has a bracket 900 formed on one end defining two large holes 902, 904. Functionally, large holes 902, 904 correspond with holes 502, 504 in the above discussion of hinge 304. Pin 308 may be identical with pin 304. The end of elongate member 300 opposite hinge 304 forms the remainder of hinge 308. It has a bracket 518 formed thereon defining a large hole 520 and a small hole 522. Functionally, large hole 520 corresponds with hole 508 in the above discussion, and small hole 522 corresponds with hole 510. Hinge 308 may be assembled in the same manner as is hinge 304. Alternatively, the large/small hole pair may be placed on bracket 900, while the large/large hole pair may be placed on bracket 518. Rack coupler 310 may be secured to corner post 306 by means of spring-loaded captive screws 906. Screws 906 may engage threads on a flange 320 formed on the slide rail assembly.

A preferred embodiment for cable ties 318 will now be described in detail with reference to FIGS. 5, 7, 10 and 11. Elongate members 300, 302 each have slot pairs 524, 526 formed therein along their lengths. Slot pairs 524, 526 are for retaining cable ties 318. In a preferred embodiment, each of cable ties 318 may be a strap 1000 made of a material having hooks on one side 1002 and loops on the other side 1004. A suitable material for this purpose would be, for example, "Velcro." Preferably, strap 1000 should have a head 1006 on one end. The junction between head 1006 and the body of strap 1000 defines shoulders 1008. Within head 1006 is a slot 1010 wide enough for the body of strap 1000 to fit through it.

Figure 11:
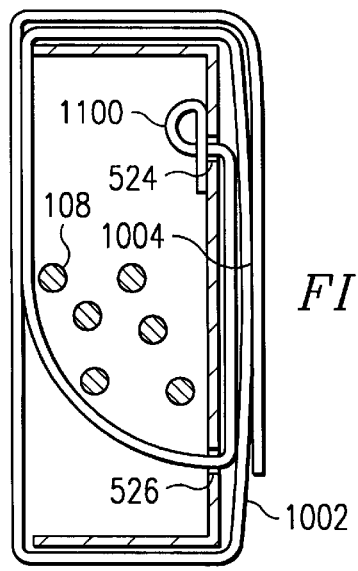
FIG. 11 is a cross sectional view illustrating a preferred technique for attaching the cable tie strap of FIG. 10 to the cable management arm of FIG. 1.

To engage strap 1000 with an elongate member, the body of strap 1000 is looped around and through slot 1010 as shown at 1100. Then, the body of strap 1000 is passed through slot 524 from the inside of the u-shaped cross section of the elongate member until shoulders 1008 engage the inside surface of the elongate member. Strap 1000 is then threaded back inside the elongate member through slot 526. This having been done, strap 1000 will now be captive to the elongate member. Cables 108 are then placed against the inside of the u-shaped cross section of the elongate member. Strap 1000 is then wrapped over cables 108, and then up and around the profile of the elongate member as shown in FIG. 11. When strap 1000 has wrapped far enough around, the loops on side 1004 will engage the hooks on side 1002, thus securing strap 1000 in position. Cables 108 may be freed, and strap 1000 removed if necessary, by reversing the just-described procedure.

While the invention has been described herein with reference to a particular embodiment, the illustrated embodiment has been shown by way of example and not by way of limitation. Persons having ordinary skill in the art and having reference to this specification will appreciate that various alternative embodiments may be created while remaining within the scope of the following claims and their equivalents.

What is claimed is:

1. Apparatus for managing computer cables in a rack, comprising:

a cable management arm comprising first and second elongate members, each having first and second ends, the first ends hingingly coupled to one another, the second end of the first elongate member adapted for hinged coupling to the rack, the second end of the second elongate member adapted for hinged coupling to a sliding computer mount; and a plurality of cable ties distributed along the length of the cable management arm for securing the computer cables thereto; wherein:

at least one of the elongate members comprises first and second slots for receiving one of the plural cable ties;

the one cable tie comprises a strap; and one end of the strap is anchored at the first slot and the rest of the strap is threaded through the second slot and wrapped around the profile of the at least one elongate member.

2. The apparatus of claim 1, wherein:

at least one of the cable ties is made of fabric having hooks on one side and loops on the other side.

3. Apparatus for managing computer cables in a rack, comprising:

a cable management arm comprising first and second elongate members, each having first and second ends, the first ends hingingly coupled to one another, the second end of the first elongate member adapted for hinged coupling to the rack, the second end of the second elongate member adapted for hinged coupling to a sliding computer mount; and a plurality of cable ties distributed along the length of the cable management arm for securing the computer cables thereto; wherein:

the hinged coupling between the first ends of the elongate members comprises a swaged pin.

4. The apparatus of claim 3, wherein:

the swaged pin comprises a body portion and a stem portion, both having a circular cross section, the body portion having a diameter larger than that of the stem portion, the junction between the stem portion and the body portion defining a shoulder;

the first end of one of the elongate members comprises a first bracket defining first and second large holes;

the first end of the other elongate member comprises a second bracket defining a third large hole and a small hole;

the first, second and third large holes are large enough to clear the body portion, and the small hole is large enough to clear the stem portion but not the body portion;

the first and second large holes are disposed between the third large hole and the small hole;

the body portion passes through the first, second and third large holes, the stem portion passes through the small hole, the shoulder is adjacent to an inside surface of the second bracket surrounding the small hole, and the stem portion is swaged over an outside surface of the second bracket surrounding the small hole.

5. The apparatus of claim 4, wherein:

the end of the pin opposite the stem portion is not swaged.

6. Apparatus for managing computer cables in a rack, comprising:

a cable management arm comprising first and second elongate members, each having first and second ends, the first ends hingingly coupled to one another, the second end of the first elongate member adapted for hinged coupling to the rack, the second end of the second elongate member adapted for hinged coupling to a sliding computer mount; and a plurality of cable ties distributed along the length of the cable management arm for securing the computer cables thereto; wherein:

the hinged coupling between the first elongate member and the rack comprises a rack coupler and a swaged pin.

7. The apparatus of claim 6, wherein:

the swaged pin comprises a body portion and a stem portion, both having a circular cross section, the body portion having a diameter larger than that of the stem portion, the junction between the stem portion and the body portion defining a shoulder;

one of the rack coupler and the first elongate member comprises a first bracket defining first and second large holes;

the other one of the rack coupler and the first elongate member comprises a second bracket defining a third large hole and a small hole;

the first, second and third large holes are large enough to clear the body portion, and the small hole is large enough to clear the stem portion but not the body portion;

the first and second large holes are disposed between the third large hole and the small hole;

the body portion passes through the first, second and third large holes, the stem portion passes through the small hole, the shoulder is adjacent to an inside surface of the second bracket surrounding the small hole, and the stem portion is swaged over an outside surface of the second bracket surrounding the small hole.

8. The apparatus of claim 7, wherein:

the end of the pin opposite the stem portion is not swaged.

9. Apparatus for managing computer cables in a rack, comprising:

a cable management arm comprising first and second elongate members, each having first and second ends, the first ends hingingly coupled to one another, the second end of the first elongate member adapted for hinged coupling to the rack, the second end of the second elongate member adapted for hinged coupling to a sliding computer mount; and a plurality of cable ties distributed along the length of the cable management arm for securing the computer cables thereto; wherein:

the hinged coupling between the second elongate member and the sliding computer mount comprises a sliding computer mount coupler and a swaged pin.

10. The apparatus of claim 9, wherein:

the swaged pin comprises a body portion and a stem portion, both having a circular cross section, the body portion having a diameter larger than that of the stem portion, the junction between the stem portion and the body portion defining a shoulder;

one of the sliding computer mount coupler and the second elongate member comprises a first bracket defining first and second large holes;

the other one of the sliding computer mount coupler and the second elongate member comprises a second bracket defining a third large hole and a small hole;

the first, second and third large holes are large enough to clear the body portion, and the small hole is large enough to clear the stem portion but not the body portion;

the first and second large holes are disposed between the third large hole and the small hole;

the body portion passes through the first, second and third large holes, the stem portion passes through the small hole, the shoulder is adjacent to an inside surface of the second bracket surrounding the small hole, and the stem portion is swaged over an outside surface of the second bracket surrounding the small hole.

11. The apparatus of claim 10, wherein:

the end of the pin opposite the stem portion is not swaged.

12. The apparatus of claim 3, wherein:

the computer cables are threaded between the cable ties and the elongate members and pass around the pin.

13. The apparatus of claim 1, wherein:

each of the first and second elongate members comprises a u-shaped cross section.

14. The apparatus of claim 13, wherein:

the computer cables are retained substantially within the u-shaped cross section of the elongate members.

* * * * *